(12) United States Patent
Yan et al.

(10) Patent No.: US 10,739,664 B2
(45) Date of Patent: Aug. 11, 2020

(54) OPTICAL MODULATOR

(71) Applicant: InnoLight Technology (Suzhou) LTD., Suzhou, Jiangsu (CN)

(72) Inventors: Dongdong Yan, Jiangsu (CN); Xiaoyao Li, Jiangsu (CN); Zhenzhong Wang, Jiangsu (CN)

(73) Assignee: InnoLight Technology (Suzhou) Ltd., Suzhou (CN)

( * ) Notice: Subject to any disclaimer, the term of this patent is extended or adjusted under 35 U.S.C. 154(b) by 0 days.

(21) Appl. No.: 16/503,684

(22) Filed: Jul. 5, 2019

(65) Prior Publication Data

US 2020/0012163 A1 Jan. 9, 2020

(30) Foreign Application Priority Data

Jul. 5, 2018 (CN) .......................... 2018 1 0727899

(51) Int. Cl.
*G02F 1/225* (2006.01)
*G02F 1/025* (2006.01)
*G02F 1/035* (2006.01)
*H05K 3/34* (2006.01)

(52) U.S. Cl.
CPC ............ *G02F 1/2255* (2013.01); *G02F 1/025* (2013.01); *G02F 1/0356* (2013.01); *G02F 1/2257* (2013.01); *H05K 3/3436* (2013.01); *G02F 2201/127* (2013.01); *H05K 2201/10621* (2013.01)

(58) Field of Classification Search
None
See application file for complete search history.

(56) References Cited

U.S. PATENT DOCUMENTS

| | | | | |
|---|---|---|---|---|
| 5,129,017 A | * | 7/1992 | Kawano | G02F 1/0356 385/2 |
| 5,548,668 A | * | 8/1996 | Schaffner | G02F 1/0356 385/1 |
| 9,036,953 B2 | * | 5/2015 | Witzens | G02F 1/0121 385/142 |
| 9,804,426 B2 | | 10/2017 | Li et al. | |
| 2017/0371099 A1 | * | 12/2017 | Chantre | H01S 5/026 |
| 2018/0011384 A1 | | 1/2018 | Cho et al. | |
| 2018/0358675 A1 | * | 12/2018 | Laighton | H01P 3/006 |
| 2019/0025507 A1 | * | 1/2019 | Murakowski | G02B 6/126 |
| 2019/0025615 A1 | * | 1/2019 | Kawamura | G02F 1/2255 |

* cited by examiner

*Primary Examiner* — Michael Stahl
(74) *Attorney, Agent, or Firm* — Finnegan, Henderson, Farabow, Garrett & Dunner, LLP

(57) ABSTRACT

An optical modulator includes: a bottom substrate layer, having a first surface; a traveling-wave electrode, being disposed on the first surface of the bottom substrate layer and including a plurality of ground electrodes and a plurality of signal electrodes between the ground electrode; an optical waveguide disposed inside the bottom substrate layer; and a shield layer, including a substrate and a metal layer, the substrate covering at least a portion of the traveling-wave electrode and the metal layer being disposed on the surface of the substrate facing away from the traveling-wave electrode. Each of the ground electrodes is electrically connected to the metal layer to provide electromagnetic shielding for the signal electrodes between the ground electrodes.

10 Claims, 5 Drawing Sheets

OPTICAL MODULATOR

CROSS-REFERENCE TO RELATED APPLICATION

This application is based upon and claims priority to Chinese Patent Application 201810727899.5, filed on Jul. 5, 2018, the entire content of which is incorporated herein by reference.

FIELD OF THE DISCLOSURE

The present application relates to the field of optical communication technology and, more particularly, to an optical modulator.

BACKGROUND

An existing optical modulation system generally includes a driver and a modulator. Traveling-wave electrode modulators have become widely used because of their higher light extinction ratio and ease of integration. Traveling-wave electrode modulators are categorized as single-electrode driven and dual-electrode driven on the basis of the driving mode, and as serial push-pull structure and separate dual-arm structure on the basis of the optical waveguide configuration. In general, as illustrated in FIG. 1, a traveling-wave electrode modulation system 100 primarily includes a driver 20 and a traveling-wave electrode modulator 10. A diagram illustrating a cross section of the traveling-wave electrode modulator 10 is shown in FIG. 2.

The principle of operation of the traveling-wave electrode modulation system 100 is as follows. The driver 20 is connected to the traveling-wave electrode modulator 10 by means of bonded leads. An optical waveguide 130 is placed in the electric field of a traveling-wave electrode 120. A high-speed digital signal output from the driver 20 reaches the traveling-wave electrode modulator 10 and propagates along the traveling-wave electrode 120. A light wave propagates in the optical waveguide 130. A change in the electric field produced by the high-speed digital signal in the traveling-wave electrode 120 causes a change to the effective refractive index of the optical waveguide 130. Therefore, when the high-speed digital signal propagates in the traveling-wave electrode 120, the electric field of the high-speed digital signal causes a change to the refractive index of the optical waveguide 130, thereby causing a change to the phase of the light wave and causing the light wave to carry the digital signal information. Light wave interference occurs in a Mach-Zehnder interferometer at a back end, thereby completing the modulation.

During actual use, the entire traveling-wave electrode modulator chip generally is a complete chip with four, eight, or even more channels. The more the channels, the smaller the spacings between the channels, resulting in crosstalk between the channels on the chip. FIG. 3 is a diagram illustrating the electromagnetic field radiation inside a traveling-wave electrode modulator during use. As shown in FIG. 3, an optical modulator is installed on a heat sink, i.e., a heat sink pad 30 is disposed below a bottom substrate layer 110 of the chip. The heat sink pad 30 is typically a metal pad and, at the same time, functions as a metal ground layer. The electromagnetic field 150 of a signal electrode 121 might radiate into free space. Such radiation causes the problem of electromagnetic radiation. The signal electrode 121 is disposed between ground electrodes 122. A part of the electromagnetic field 150 might also couple to an adjacent channel to cause crosstalk. The crosstalk produces a noise in the signal, eventually affecting the bit error rate of a link. Moreover, a common mode voltage output from the driver 20 might cause relatively high electromagnetic radiation from the traveling-wave electrode at the end closer to the traveling-wave electrode modulator chip, causing failure of module authentication and other problems.

SUMMARY

The purpose of the embodiments of the present disclosure is to provide an optical modulator that may effectively prevent crosstalk between each channel of the optical modulator through isolation and, at the same time, solve the problem of high electromagnetic radiation from traveling-wave electrodes.

In order to achieve one of the aforementioned purposes, the present application provides an optical modulator, including: a bottom substrate layer, having a first surface; a traveling-wave electrode, being disposed on the first surface of the bottom substrate layer and including a plurality of ground electrodes and a plurality of signal electrodes between the ground electrodes; an optical waveguide disposed inside the bottom substrate layer; a shield layer, including a substrate and a metal layer, the substrate covering at least a portion of the traveling-wave electrode, and the metal layer being disposed on the surface of the substrate facing away from the traveling-wave electrode. Each of the ground electrodes is electrically connected to the metal layer to provide electromagnetic shielding for the signal electrodes between the ground electrodes.

Embodiments of the present disclosure have the following benefits: (1) by adding a metal shield layer to the electrodes of a traveling-wave electrode modulator and electrically connecting each ground electrode to the metal layer of the shield layer, crosstalk between each channel of the optical modulator may be effectively prevented through isolation, and electromagnetic radiation from traveling-wave electrodes may be blocked, thus solving the problem of high electromagnetic radiation from the traveling-wave electrodes; and (2) selecting a dielectric material that has a suitable dielectric constant to form the substrate of the shield layer covering the traveling-wave electrode may enable the effective dielectric constant of the material around the traveling-wave electrode to match the effective refractive index of the optical waveguide, thereby enabling the velocity of propagation of the electromagnetic wave to be the same as the velocity of propagation of the light wave so that the waves completely match, thus increasing the electro-optic modulation bandwidth and modulation performance of the traveling-wave electrode modulator.

DETAILED DESCRIPTION

Figure 1:
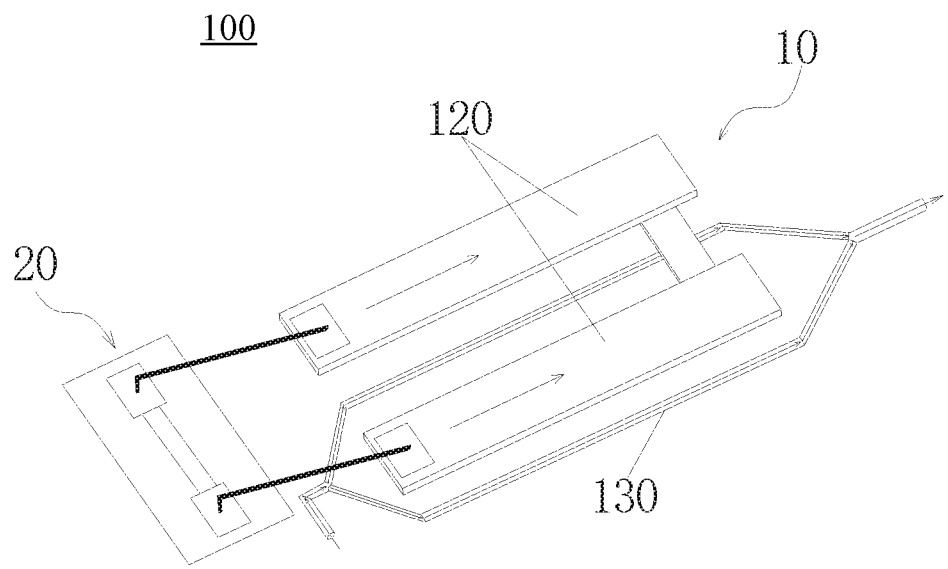
FIG. 1 is a diagram illustrating a traveling-wave electrode modulation system in existing technology.
Figure 2:
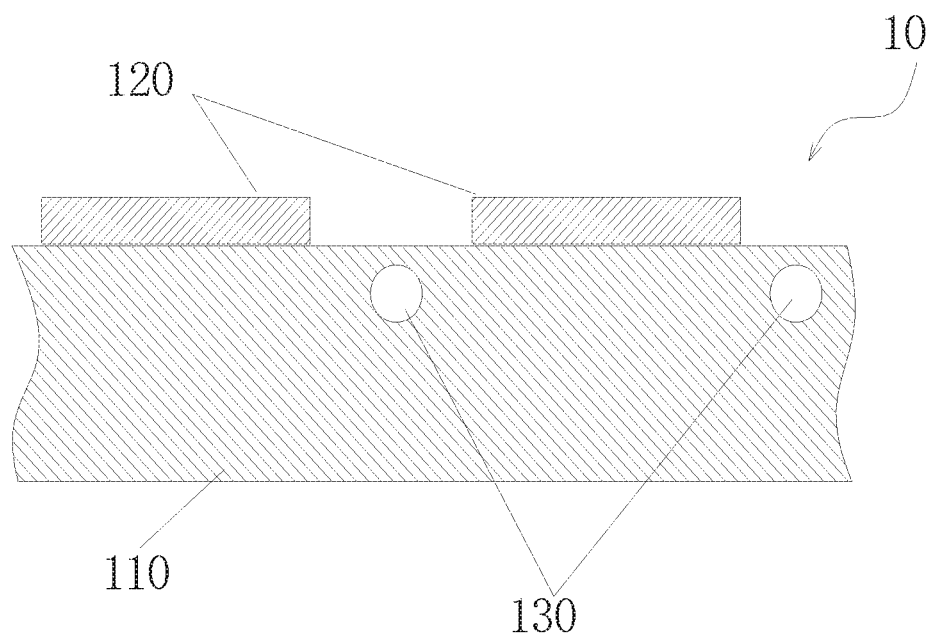
FIG. 2 is a diagram illustrating a cross section of a traveling-wave electrode modulator in existing technology.
Figure 3:
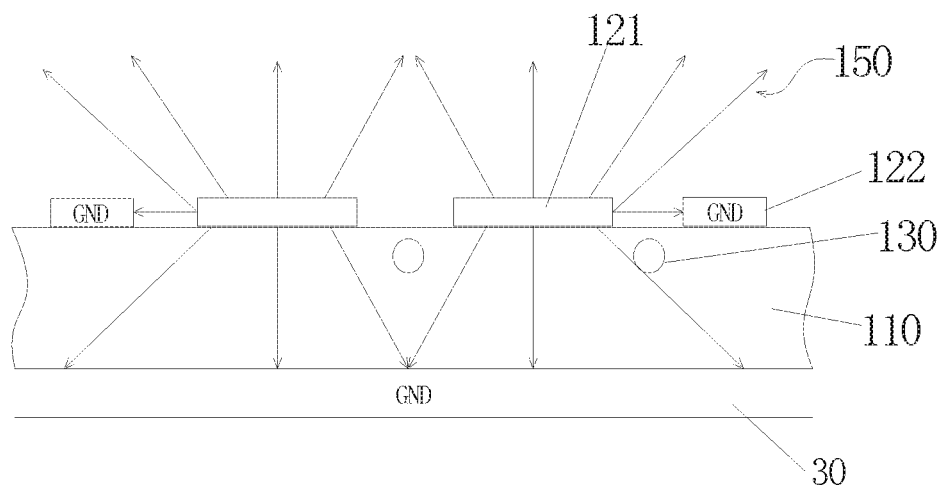
FIG. 3 is a diagram illustrating the electromagnetic field inside a traveling-wave electrode modulator in existing technology.

The text below provides a detailed description of the present application with reference to specific embodiments illustrated in the attached drawings. However, these embodiments do not limit the present application; the scope of protection for the present application covers changes made to the structure, method, or function by persons having ordinary skill in the art on the basis of these embodiments.

In order to facilitate the presentation of the drawings in the present application, the sizes of certain structures or portions have been enlarged relative to other structures or portions; therefore, the drawings in the present application are only for the purpose of illustrating the basic structure of the subject matter of the present application.

Additionally, terms in the text indicating relative spatial position, such as "upper," "above," "lower," "below," and so forth, are used for explanatory purposes in describing the relationship between a unit or feature depicted in a drawing with another unit or feature therein. Terms indicating relative spatial position may refer to positions other than those depicted in the drawings when a device is being used or operated. For example, if a device shown in a drawing is flipped over, a unit which is described as being located "below" or "under" another unit or feature will be located "above" the other unit or feature. Therefore, the illustrative term "below" may include positions both above and below. A device may be oriented in other ways (rotated 90 degrees or facing another direction), and descriptive terms that appear in the text and are related to space should be interpreted accordingly. When a component or layer is said to be "above" another part or layer or "connected to" another part or layer, it may be directly above the other part or layer or directly connected to the other part or layer, or there may be an intermediate component or layer.

Figure 4:
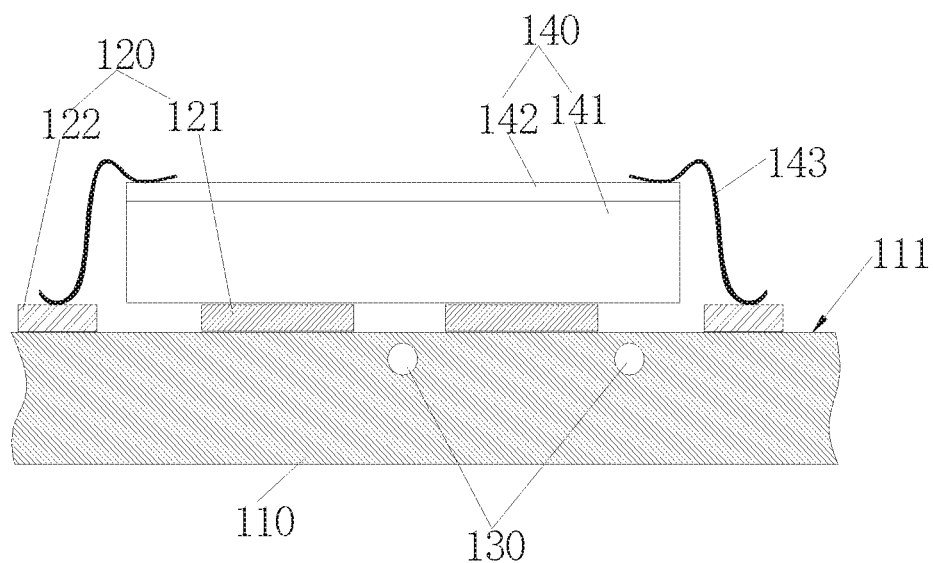
FIG. 4 is a diagram illustrating a cross section of a traveling-wave electrode modulator in one exemplary embodiment of the present disclosure.

FIG. 4 is a partial sectional view illustrating an optical modulator 400 in one exemplary embodiment of the present disclosure. The optical modulator 400 includes: a bottom substrate layer 110, having a first surface 111; a traveling-wave electrode 120, being disposed on the first surface 111 of the substrate layer 110 and including a plurality of ground electrodes 122 and a plurality of signal electrodes 121 between the ground electrodes 122; an optical waveguide 130, being disposed inside the substrate layer 110 and matching the traveling-wave electrode 120; and a shield layer 140, including a substrate 141 and a metal layer 142, the substrate 141 covering at least a portion of the traveling-wave electrode 120 and the metal layer 142 being disposed on the surface of the substrate 141 facing away from the traveling-wave electrode 120. Generally, when a traveling-wave electrode includes only one ground electrode (G) and only one signal electrode (S), an optical waveguide is disposed in a substrate layer at a position corresponding to a position between the ground electrode (G) and the signal electrode (S). On the other hand, the traveling-wave electrode 120 included in the optical modulator 400 illustrated in FIG. 4 has a GSSG (Ground-Signal-Signal-Ground) structure, which includes two ground electrodes 122 (left-side ground electrode 122 and right-side ground electrode 122) and two signal electrodes 121 (left-side signal electrode 121 and right-side signal electrode 121) disposed between the two ground electrodes 122. As illustrated in FIG. 4, there are two optical waveguides 130 (left-side optical waveguide 130 and right-side optical waveguide 130). The left-side optical waveguide 130 is disposed corresponding to a position between the left-side signal electrode 121 and the right-side signal electrode 121. The right-side optical waveguide 130 is disposed corresponding to a position between the right-side signal electrode 121 and right-side ground electrode 122. In the embodiment illustrated in FIG. 4, only the left-side optical waveguide 130 is being used, while the right-side optical waveguide 130 is not used. The terms "left" and "right" are relative terms applied with reference to the sectional view shown in FIG. 4 and are used for descriptive convenience only. Each of the ground electrodes 122 is electrically connected to the metal layer 142 to provide electromagnetic shielding for the signal electrodes 121 between the ground electrodes 122. Each of the ground electrodes 122 may have a plurality of electrical connections to the metal layer 142, and the spacing between two adjacent electrical connections between the ground electrode 122 and the metal layer 142 is less than or equal to 200 microns. In an exemplary embodiment, a plurality of conductive leads 143 are bonded on the same ground electrode 122 to electronically connect the ground electrode 122 to the metal layer 142, thus electromagnetically shielding the signal electrode 121.

Figure 5:
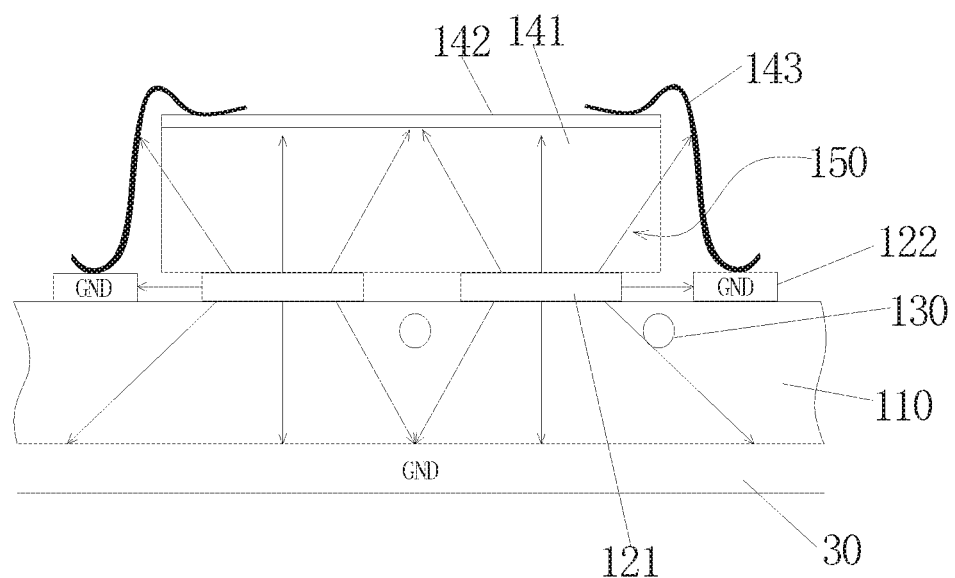
FIG. 5 is a diagram illustrating the electromagnetic field inside the traveling-wave electrode modulator in the exemplary embodiment illustrated in FIG. 4.

As illustrated in FIG. 5, during use, an optical modulator chip is generally installed on a heat sink, i.e., a heat sink pad 30 is disposed below the bottom substrate layer 110 of the chip. The heat sink pad 30 is typically a metal pad and, at the same time, functions as a metal ground layer GND. The metal layer 142, the conductive lead 143, and the ground electrodes 122 of the optical modulator 400 together with the heat sink pad 30 form a shield cover. The shield cover blocks the electromagnetic field 150 from radiating into free space, thereby electromagnetically shielding the electromagnetic wave transmitted by the signal electrodes 121 between two ground electrodes 122. This may effectively prevent crosstalk between different channels of the optical modulator and, at the same time, solve the problem of high electromagnetic radiation from the traveling-wave electrodes. In a practical application, according to requirements such as the electromagnetic field strength, spacing between the channels, and electromagnetic shielding, the spacing between the conductive leads 143 on the same ground electrode may be designed to effectively shield the electromagnetic field. For example, in this exemplary embodiment, the spacing between the conductive leads on the same ground electrode may be set to be less than or equal to 200 microns. The conductive leads may be spaced evenly or unevenly according to requirements of practical applications.

Figure 6:
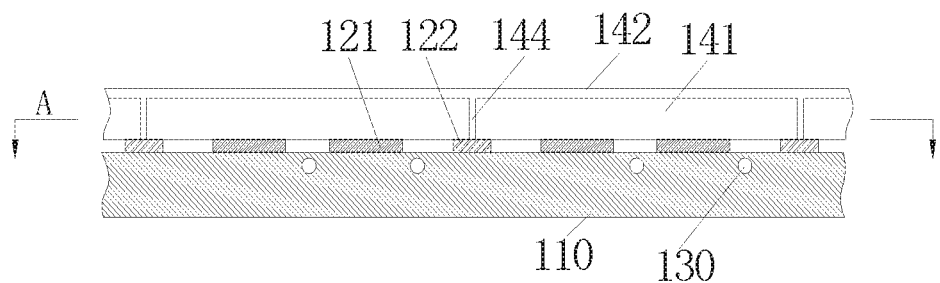
FIG. 6 is a diagram illustrating a cross section of a traveling-wave electrode modulator in another exemplary embodiment of the present disclosure.
Figure 7:
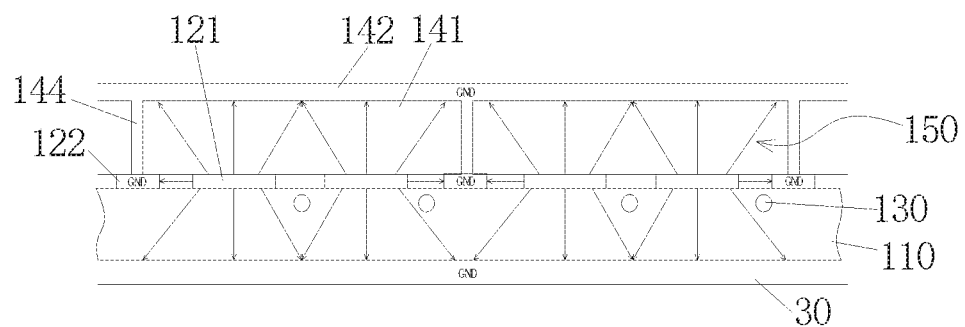
FIG. 7 is a diagram illustrating the electromagnetic field inside the traveling-wave electrode modulator in the exemplary embodiment illustrated in FIG. 6.
Figure 8:
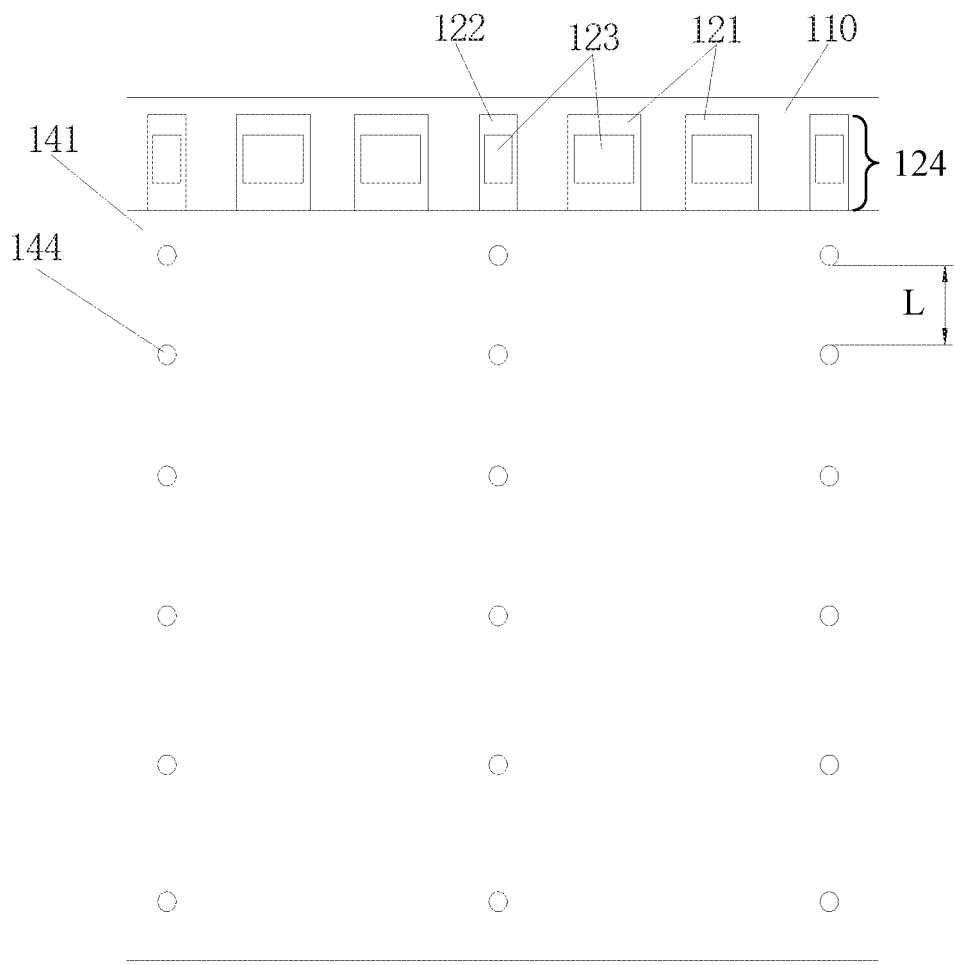
FIG. 8 is a diagram illustrating an exemplary embodiment of conductive vias on a substrate in a cross section along direction A in the exemplary embodiment illustrated in FIG. 6.

FIGS. 6 through 8 are partial sectional views illustrating another exemplary embodiment of the present disclosure. This exemplary embodiment differs from the previous exemplary embodiment in that the previous exemplary embodiment shields each channel individually and thus requires a relatively complicated manufacturing process when the modulator has a large number of channels. In the optical modulator in the present exemplary embodiment, a shield layer is provided by forming a one-piece substrate 141 covering a plurality of channels, forming conductive vias 144 on the one-piece substrate 141 at locations corresponding to the ground electrodes 122 corresponding to the channels, and electrically connecting the ground electrodes 122 and the metal layer 142 by the conductive vias 144. As illustrated in FIG. 7, the metal layer 142, the conductive vias 144, and the ground electrodes 122, together with an external heat sink pad 30, form a shield cover, allowing the electromagnetic field 150 of each channel to be confined completely inside the shield cover, thereby electromagnetically shielding the electromagnetic wave transmitted by the signal electrodes 121 between two ground electrodes 122. This may effectively prevent crosstalk between channels of the optical modulator through isolation and, at the same time, solve the problem of high electromagnetic radiation from traveling-wave electrodes. This structure can simply and quickly shield a plurality of channels as a whole and eliminate crosstalk between channels, thus reducing a large amount of lead bonding work, effectively increasing production efficiency, and eliminating problems such as unreliability in the lead bonding process. Similar to the previous exemplary embodiment, in a practical application, a spacing L between the conductive vias corresponding to the same ground electrode is designed according to requirements such as electromagnetic field strength, spacing between the channels, and electromagnetic shielding, to effectively shield the electromagnetic field. For example, in this exemplary embodiment, the spacing L between each conductive via on the same ground electrode may be set to be less than or equal to 200 microns. The conductive vias may be spaced evenly or unevenly according to practical application requirements.

Figure 9:
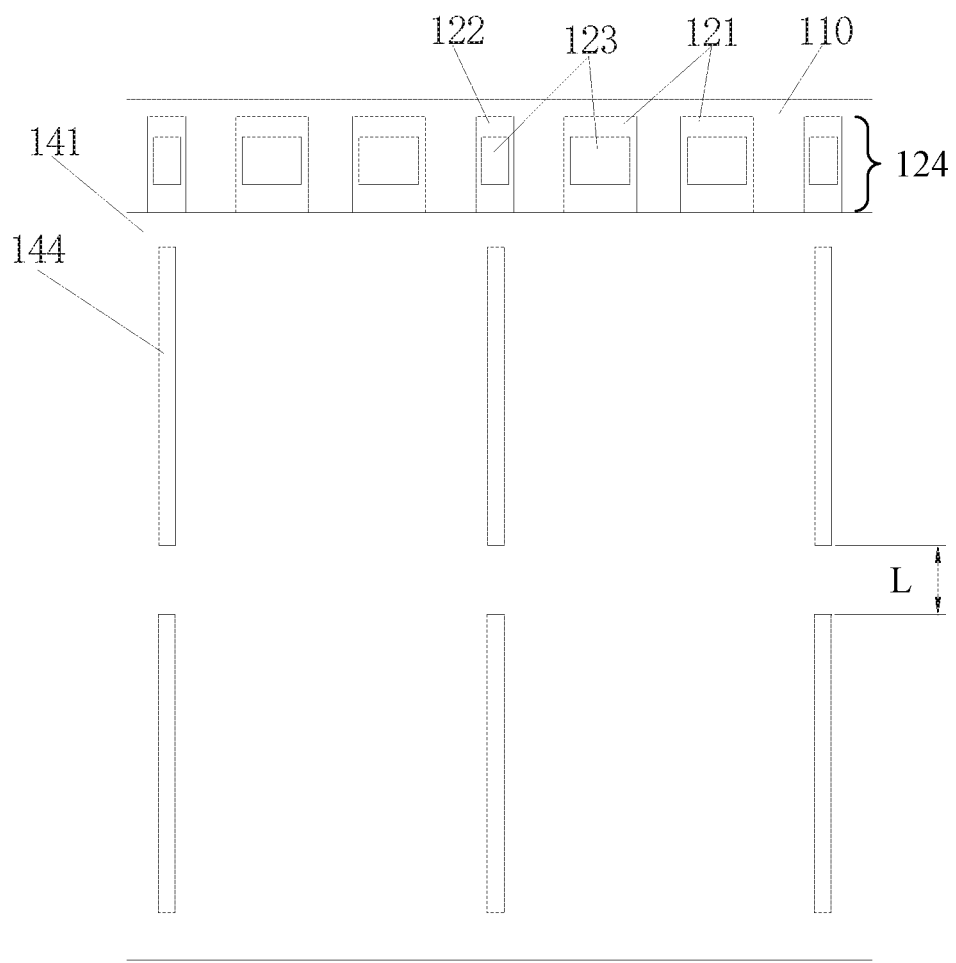
FIG. 9 is a diagram illustrating another exemplary embodiment of conductive vias on the substrate in a cross section along direction A in the exemplary embodiment illustrated in FIG. 6.

As illustrated in FIG. 8, the cross sections of the conductive vias 144 in this exemplary embodiment are round. Conductive vias 144 that have triangular, squarer, rectangular, and other polygon-shaped cross sections may also be used. Even conductive vias 144 that have thin and long cross sections may be used, as illustrated in FIG. 9. The conductive vias 144 corresponding to the same ground electrode 122 may be connected to form a conductive surface to act as an electromagnetic shielding plane.

In each of the aforementioned exemplary embodiments, as an electromagnetic shield layer, the metal layer 142 on the substrate 141 may be a metal film or plate. The metal layer 142 may also be a metal mesh, and the density of the mesh is designed according to the requirements of actual use. As illustrated in FIG. 8 or 9, the substrate 141 covers the traveling-wave electrode 120 (including the ground electrode 122 and the signal electrode 121). The traveling-wave electrode 120 has an extension 124 extending beyond one end of the substrate 141. The extension 124 is electrically connected to a solder pad 123. The traveling-wave electrode 120 is connected to an external electric circuit (e.g., a driver) by leads bonded to the solder pad 123.

On the foundation of each of the previous exemplary embodiments, another exemplary embodiment of the present disclosure further aims to resolve the mismatch between the electromagnetic wave and the light wave. Such mismatch results in the inability of the high-speed signal to act fully throughout the entire distance on the light wave that simultaneously enters the traveling-wave electrode, thus reducing electro-optic modulation bandwidth of the entire traveling-wave electrode modulator. The substrate 141 in each of the previous exemplary embodiments may be made of a dielectric material. The dielectric material is selected by simulation design to have an effective dielectric constant that enables a matching between the velocity of the electromagnetic wave in the traveling-wave electrode and the velocity of the light wave in the optical waveguide. For example, in usual circumstances, the effective dielectric constant of the traveling-wave electrode modulator is relatively low in general. Thus, the velocity of propagation of the electromagnetic wave is greater than the velocity of propagation of the light wave needing modulation, thereby resulting in a mismatch between the electromagnetic wave and the light wave. In such circumstances, a dielectric material having a relatively high dielectric constant may be selected as the material of the substrate in order to increase the effective dielectric constant around the traveling-wave electrode, thereby enabling the velocity of propagation of the electromagnetic wave to be the same as the velocity of propagation of the light wave so that the two waves completely match, thus increasing the electro-optic modulation bandwidth and modulation performance of the traveling-wave electrode modulator. Preferably, the dielectric material is silicon dioxide, monocrystalline silicon, polycrystalline silicon, ceramic, aluminum oxide, or another material having a relatively high dielectric constant. Such dielectric material may be deposited or grown on the traveling-wave electrode by means of semiconductor processing techniques, or may be adhered onto the traveling-wave electrode by means of an adhesive medium.

Each of the aforementioned exemplary embodiments may be applicable to traveling-wave electrode modulators of all junctions and structures, such as GSSG (Ground-Signal-Signal-Ground) traveling-wave electrodes, SGS (Signal-Ground-Signal) traveling-wave electrodes, and T-rail traveling-wave electrodes. Descriptions of the specific structures of the bottom substrate layer and the optical waveguide will not be repeated here.

The detailed descriptions above is only intended to provide specific descriptions of feasible embodiments of the present application. They are not to be construed as limiting the scope of protection for the present application; all equivalent embodiments or changes that are not detached from the techniques of the present application in essence should fall within the scope of protection of the present application.

What is claimed is:

1. An optical modulator, comprising:
   a bottom substrate layer, having a first surface;
   a traveling-wave electrode, being disposed on the first surface of the bottom substrate layer and comprising a plurality of ground electrodes and a plurality of signal electrodes between the ground electrodes; and
   an optical waveguide disposed inside the bottom substrate layer; and
   a shield layer, comprising a substrate and a metal layer, the substrate covering at least a portion of the traveling-wave electrode, and the metal layer being disposed on the surface of the substrate facing away from the traveling-wave electrode,
   wherein each of the ground electrodes is electrically connected to the metal layer to provide electromagnetic shielding for the signal electrodes between the ground electrodes.

2. The optical modulator of claim 1, wherein each of the ground electrodes has a plurality of electrical connections to the metal layer.

3. The optical modulator of claim 2, wherein each of the ground electrodes is electrically connected to the metal layer by a plurality of conductive leads.

4. The optical modulator of claim 2, wherein a plurality of conductive vias are arranged on the substrate at locations corresponding to the plurality of ground electrodes,
    the ground electrodes being electrically connected to the metal layer by the conductive vias.

5. The optical modulator of claim 2, wherein the spacing between two adjacent electrical connections between one of the ground electrodes and the metal layer is less than or equal to 200 microns.

6. The optical modulator of claim 1, wherein the traveling-wave electrode has an extension extending beyond the substrate, the extension being electrically connected to a solder pad.

7. The optical modulator of claim 1, wherein the substrate is made of a dielectric material.

8. The optical modulator of claim 7, wherein the dielectric material has an effective dielectric constant that enables a matching between a velocity of an electromagnetic wave in the traveling-wave electrode and a velocity of a light wave in the optical waveguide.

9. The optical modulator of claim 7, wherein the dielectric material is silicon dioxide, monocrystalline silicon, polycrystalline silicon, ceramic, or aluminum oxide.

10. The optical modulator of claim 8, wherein the dielectric material is deposited or grown on the traveling-wave electrode by means of semiconductor processing techniques or is adhered onto the traveling-wave electrode by means of an adhesive medium.

\* \* \* \* \*